(12) United States Patent
Moon

(10) Patent No.: US 6,930,310 B2
(45) Date of Patent: Aug. 16, 2005

(54) METHOD AND APPARATUS FOR DRIVING X-RAY DETECTING DEVICE

(75) Inventor: Beom Jin Moon, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 94 days.

(21) Appl. No.: 10/177,146

(22) Filed: Jun. 24, 2002

(65) Prior Publication Data

US 2003/0080299 A1 May 1, 2003

(30) Foreign Application Priority Data

Nov. 1, 2001 (KR) ..................... P2001-67778

(51) Int. Cl.$^7$ ............................................ H01L 27/00
(52) U.S. Cl. ............................................... 250/370.09
(58) Field of Search .................... 250/370.09

(56) References Cited

U.S. PATENT DOCUMENTS 5,912,465 A * 6/1999 Kobayashi et al. .... 250/370.09

* cited by examiner

*Primary Examiner*—Constantine Hannaher
(74) *Attorney, Agent, or Firm*—McKenna Long & Aldridge LLP (57) ABSTRACT

Driving methods that improve image quality by reducing brightness degradation at the center of a composite panel X-ray detecting device caused by current leakage, and composite panel X-ray detecting devices that are driven using those methods. In the method and apparatus, a composite panel comprised of at least two X-ray detecting panels is scanned from the center of the composite panel toward vertical outer edges. Data is read out from the X-ray detecting panels in either the same or in different directions.

22 Claims, 12 Drawing Sheets

METHOD AND APPARATUS FOR DRIVING X-RAY DETECTING DEVICE

This application claims the benefit of Korean Patent Application No. P2001-67778, which was filed on Nov. 1, 2001, and which is hereby incorporated by reference for all purposes as if fully set forth herein.

BACKGROUND OF THE INVENTION

1. Field of the Invention

The present invention relates to X-ray detecting devices, and more particularly, to driving methods for improving image quality and to X-ray detecting apparatus driven by those methods.

2. Description of the Related Art

Some medical and scientific imaging systems produce an image by detecting visible light. However, most medical and scientific imaging systems detect either infrared or X-rays. For example, X-ray imaging systems used in medical applications provide images of the interior of a human body. Such systems have typically used an X-ray sensitive film. However, newer systems often use an X-ray detecting device that produces electrical signal in response to received X-rays.

Figure 1:
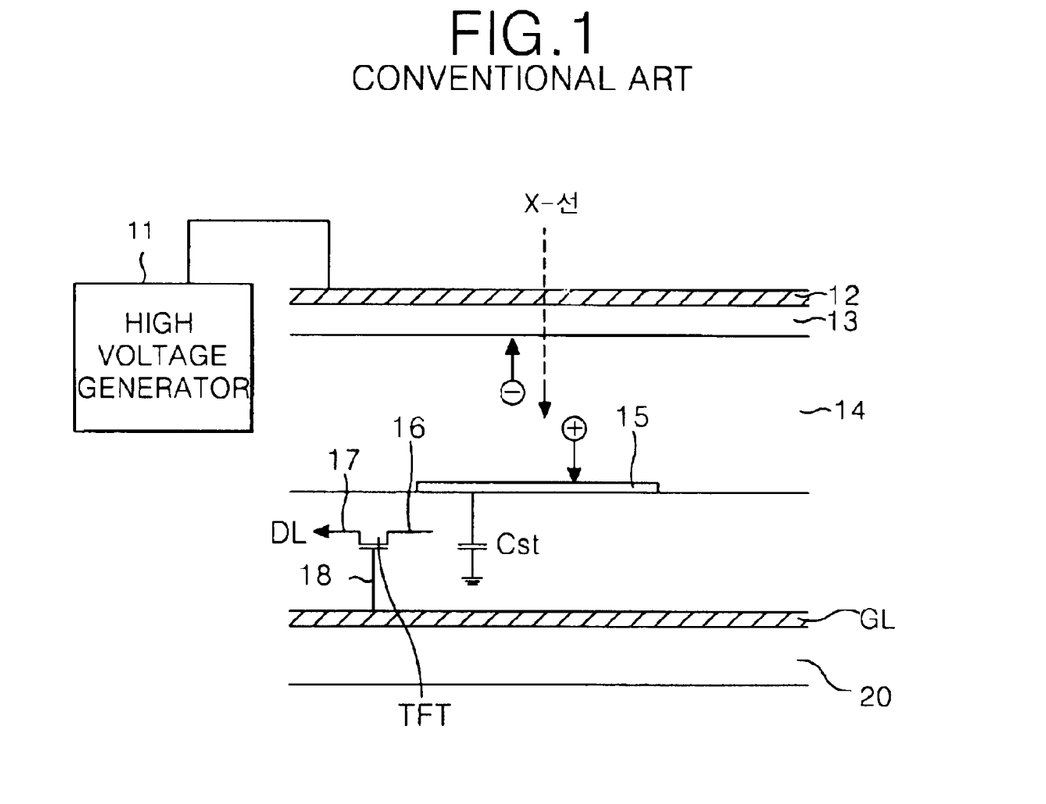
FIG. 1 is an equivalent circuit diagram of an X-ray detecting device for explaining driving principles of an X-ray detecting device.
Figure 2:
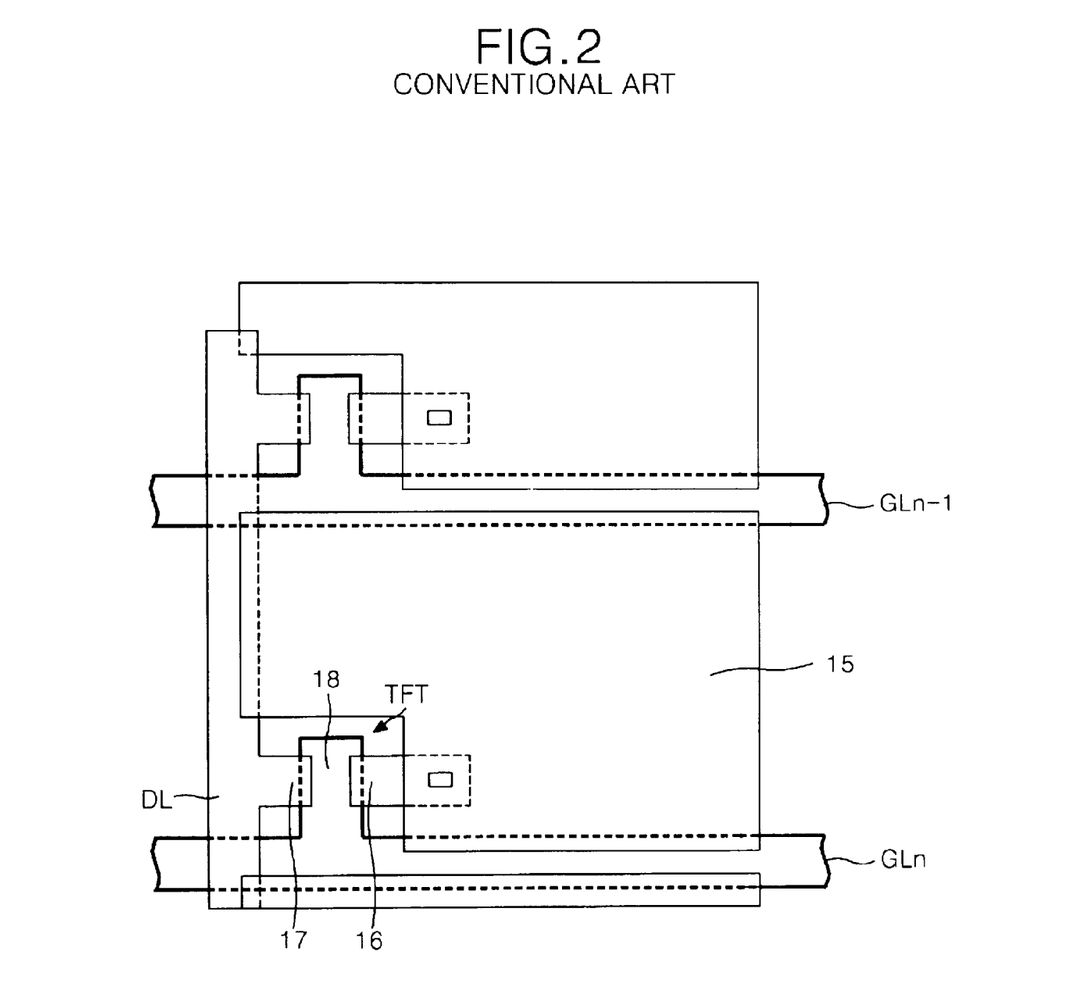
FIG. 2 is a plan view of one cell of the X-ray detecting device shown in FIG. 1.

Referring now to FIG. 1 and FIG. 2, a typical X-ray detecting device includes gate lines GLn-1 and GLn and data lines DL (only one shown) that cross the gate lines. Those lines are disposed on a glass substrate 20. A thin film transistor (TFT) is provided at each intersection of a gate line (GLn-1 and GLn) and a data line DL. A pixel electrode 15 is connected to the TFT, and a capacitor Cst is connected between the pixel electrode 15 and a ground. An upper electrode 12, having a dielectric layer 13, is connected to a high voltage generator 11. A photosensitive layer 14 is disposed between the dielectric layer 13 and the pixel electrode 15.

Still referring to those figures, a gate electrode 18 of each TFT is connected to a gate line (GLn-1 and GLn in FIG. 2), while a source electrode 17 of each TFT is connected to a data line DL. A drain electrode 16 of each TFT is connected to a pixel electrode 15. The TFTs selectively respond to scanning signals that are sequentially applied to the gate lines GLn-1 and GLn so as to apply a current in each TFT capacitor Cst to a data line DL.

The pixel electrode 15 is at a pixel area between gate lines GLn-1 and GLn and data lines DL. The pixel electrode 15 supplies electric charges produced within the photosensitive layer 14 to the capacitor Cst in response to the high voltage from the high voltage generator 11.

Still referring to FIGS. 1 and 2, X-rays irradiated through an object pass through the upper electrode 12 and the dielectric layer 13 and into the photosensitive layer 14. The photosensitive layer 14 converts those received X-rays into electron-hole pairs. The high voltage (of several kV) from the high voltage generator 11 that is applied (via the upper electrode 12 and the dielectric layer 13) across the photosensitive layer 14 separates the electrons and holes. The holes are collected by the pixel electrode 15 and are stored in the capacitor Cst.

When a scanning signal is applied to the gate electrode 18 of a TFT, a channel is formed between the source electrode 17 and the drain electrode 16 of that TFT. Electric charges stored in the capacitor Cst associated with that gate electrode 18 are then supplied, via the drain electrode 16 and the source electrode 17, to a data line DL.

Figure 3:
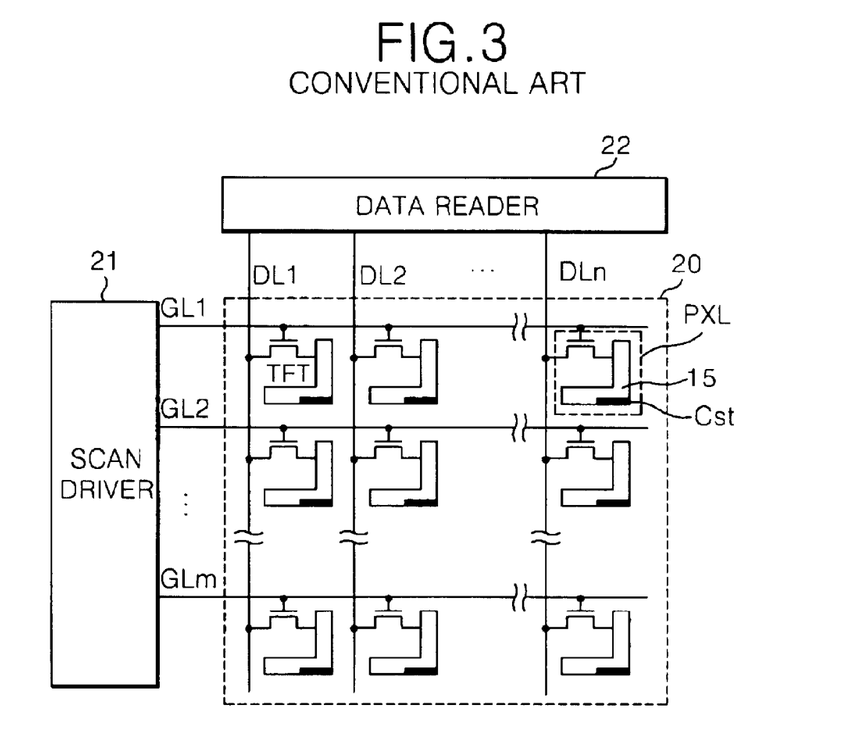
FIG. 3 is a block circuit diagram showing a configuration of the X-ray detecting device in FIG. 1.

Referring now to FIG. 3, a driving apparatus for driving an X-ray detecting device includes an X-ray detecting panel 20 having X-ray sensing cells PXL arranged in a matrix, a scan driver 21 for sequentially applying scanning signals to m gate lines (GL1 to GLm), and a data reader 22 for reading data on n data lines (DL1 to DLn). Each X-ray sensing cells PXL is substantially identical to the cell shown in FIG. 1 and FIG. 2. When scanning signals from the scan driver 21 are sequentially applied to the gate lines (GL1 to GLm), X-ray data is supplied, via the n data lines (DL1 to DLn), to the data reader 22.

Figure 4:
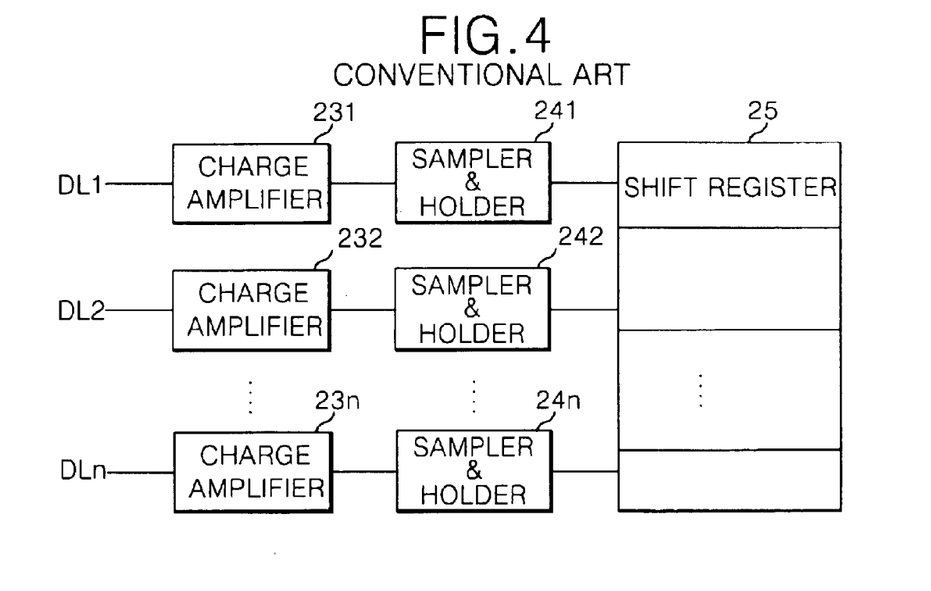
FIG. 4 is a block diagram showing a configuration of the data reader in FIG. 3.

As shown in FIG. 4, the data reader 22 includes charge amplifiers 231 to 23n, and samplers & holders 241 to 24n. The charge amplifiers are respectively connected to associated n data lines DL1 to DLn. A shift register 25 latches data from the samplers & holders 241 to 24n. Each charge amplifier 231 to 23n amplifies charge supplied on a data line (DL1 to DLn) by a current gain. The amplified currents are applied to the samplers and holders 241 to 24n. The samplers & holders 241 to 24n sample the data from the charge amplifiers 231 to 23n and apply sampled data to the shift register 25. The shift register 25 has n stages, corresponding to the n data lines DL1 to DLn, that sequentially latch the data from the samplers & holders 241 to 24n. Furthermore, the shift register 25 supplies latched data to an output circuit (which is not shown). The output circuit converts analog data from the data reader 22 into digital data that is applied to a display device (also not shown).

1X-ray detecting devices preferably have both a high resolution and a large viewing area. Recently, a scheme has been developed in which two or four X-ray detecting panels 20 are combined into a large-screen composite X-ray panel in such a way as to achieve both a high resolution and a large viewing area:. Such a composite X-ray panel has advantages over a comparable integral X-ray detecting panel in that scanning a composite X-ray panel can be performed by simultaneously scanning individual panels, which leads to a reduced scan time and to reduced signal attenuation caused by signal delay.

Figure 5:
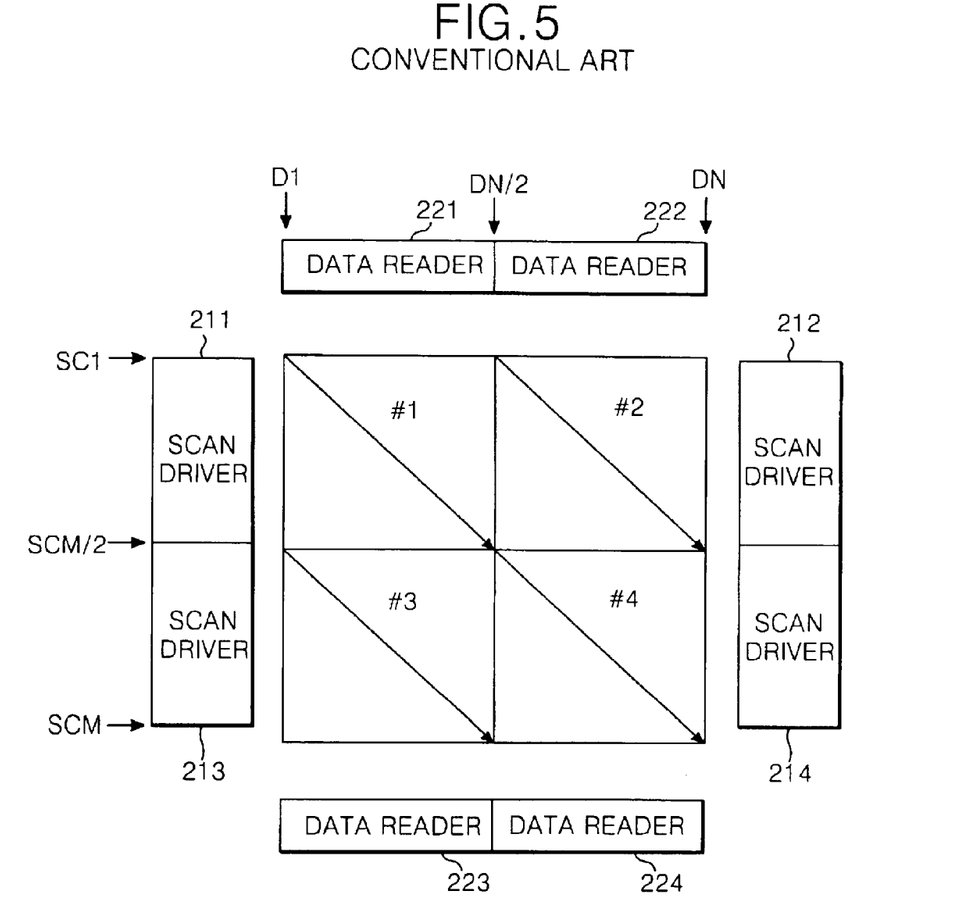
FIG. 5 is a block diagram showing a conventional composite X-ray panel made by a combination of four individual X-ray detecting panels, FIG. 5 also illustrates scanning of the composite X-ray panel.
Figure 6:
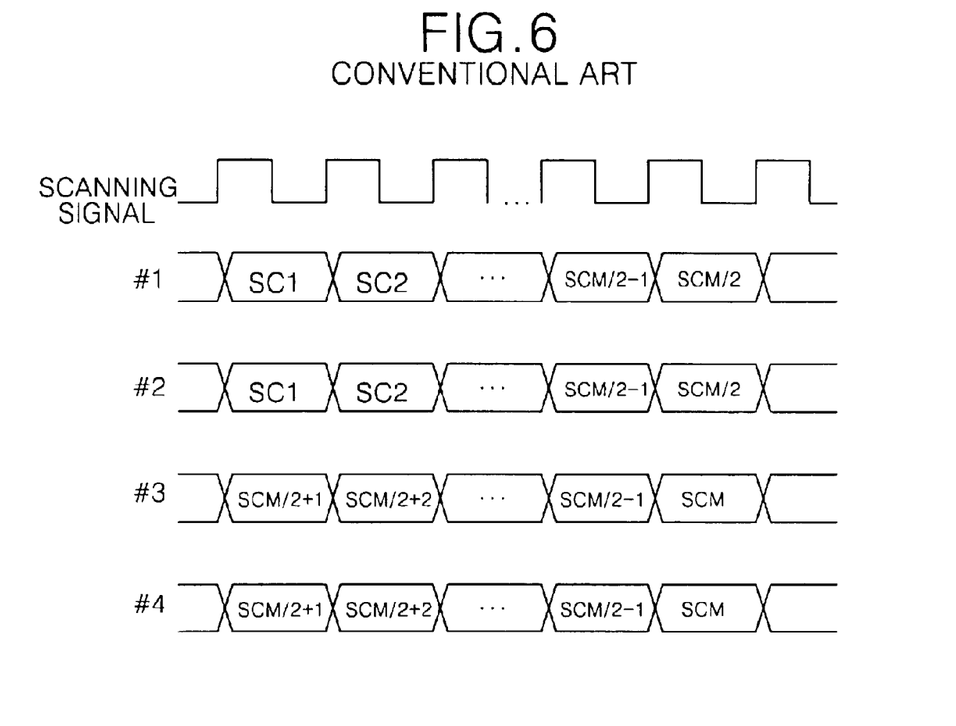
FIG. 6 illustrates scanning signal waveforms for the composite X-ray panel shown in FIG. 5.

A typical composite X-ray panel will be described in conjunction with FIG. 5 and FIG. 6. Referring to those figures, such a composite X-ray panel is made by horizontally and vertically combining four individual X-ray detecting panels, #1 to #4.

A driving apparatus for driving this composite X-ray panel includes scan drivers 211 to 214 for respectively scanning the first to fourth X-ray detecting panels #1 to #4, and data readers 221 to 224 for reading data.

The first X-ray detecting panel #1 responds to scanning signals from the first scan driver 211 in a sequence that runs from the 1st scan line SC1, which is at the upper end, to the (M/2)th scan line SCM/2, which is near the vertical center. At the same time, data from the first X-ray detecting panel #1 is sequentially read from the 1st data line D1, at the left side, to the (N/2)th data line DN/2, which is near the horizontal center, by means of the first data driver 221.

The second X-ray detecting panel #2 responds to scanning signals from the second scan driver 212 in sequence from the 1st scan line SC1, at the upper end, to the (M/2)th scan line SCM/2 which is near the vertical center. At the same time, data from the second X-ray detecting panel #2 is sequentially read from a ((N/2)+1)th data line, near the horizontal center, to an Nth data line DN on the right side by means of the second data driver 222.

The third X-ray detecting panel #3 responds to scanning signals from the third scan driver 213 in a sequence that runs from the ((M/2)+1)th scan line near the vertical center to the Mth scan line SCM at the bottom. At the same time, data from the third X-ray detecting panel #3 is sequentially read from a 1st data line D1 at the left to a (N/2)th data line DN/2 near the horizontal center by means of the third data driver 223.

The fourth X-ray detecting panel #4 responds to scanning signals from the fourth scan driver 214 in a sequence that runs from the ((M/2)+1)th scan line near the vertical center to the Mth scan line SCM. At the same time, data from the fourth X-ray detecting panel #4 is sequentially read from an ((N/2)+1)th data to the Nth data DN by means of the fourth data driver 224.

Such a composite X-ray panel can reduce the time required for data reading to ¼ that of a single X-ray panel having the same resolution and dimensions because the gate lines and the data lines are divided at boundaries between adjacent X-ray detecting panels, and because the divided X-ray detecting panels can be scanned simultaneously. Furthermore, the composite X-ray panel can reduce both data reading delays caused by an RC time constant associated with the data lines and noise because the data line length is ½ that of a single X-ray panel having the same resolution and size.

Figure 7:
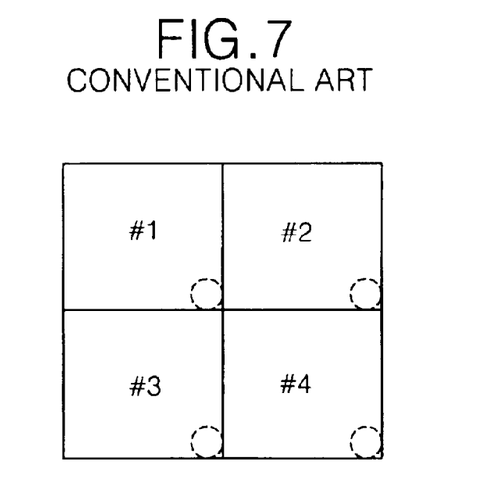
FIG. 7 is a plan view showing areas having significant charge leakage in the composite X-ray panel shown in FIG. 5.

However, the composite X-ray panel suffers from reduced image quality. In particular, the center area brightness is reduced. Unfortunately, the center area is both the most sensitive area to the human observer and typically contains the most important reading information. Center area brightness reduction is caused by the fact that as the delay between charging and scanning a capacitor Cst increases, so does charge leakage. For instance, the capacitors Cst associated with the 1st scan line SC1 and the ((M/2)+1)th scan line SCM/2+1, which are read first, have a relatively small charge leakage, whereas the capacitors Cst associated with the (M/2)th scan line SCM/2 and the Mth scan line SCM have a relatively large charge leakage because they are scanned last. As a result, referring now to FIG. 7, in a conventional composite X-ray panel the center area and the area at the bottom right edge, both indicated by dotted lines, have significantly more leakage, and thus have reduced brightness, than other areas.

Therefore, a method of reducing charge leakage and image brightness problems in composite X-ray panels would be beneficial.

SUMMARY OF THE INVENTION

Accordingly, the present invention is directed to methods of driving X-ray detecting devices with composite X-ray panels so as to improve image quality, thus substantially obviating one or more of the problems due to limitations and disadvantages of the related art. Also accordingly, the present invention is directed to X-ray detecting devices with composite X-ray panels that are driven in a manner so as to improve image quality.

To achieve these and other objects of the invention, a method of driving an X-ray detecting device having a composite X-ray panel according to one aspect of the present invention includes scanning and reading information from at least two X-ray detecting panels using sequences that runs from the composite panel's center toward the edges.

According to the principles of the present invention the two X-ray detecting panels can be scanned in the same or in opposite directions. Furthermore, data can be read from the two X-ray detecting panels in the same direction or in opposite directions.

An X-ray detecting device according to another aspect of the present invention includes a composite X-ray panel comprised of at least two X-ray detecting panels; a scan driver for scanning the composite X-ray panel using a sequence that runs from the center of the composite X-ray panel toward an outer edge (up) of the composite X-ray panels; and a data reader for reading data from the composite X-ray panel during scanning.

According to the principles of the present invention the scan driver can scan the at least two X-ray detecting panels in the same or in opposite scanning directions.

Beneficially, the composite X-ray panel is comprised of at least two X-ray detecting panels in each of the vertical and horizontal directions.

The scan driver beneficially includes a first scanning circuit for horizontally scanning upper first and second X-ray detecting panels in opposite directions; and a second scanning circuit circuit for horizontally scanning lower third and fourth X-ray detecting panels, positioned under the first and second X-ray detecting panels, in opposite directions.

Then, the data reader beneficially includes a first data reading circuit for horizontally reading data from the upper first and second X-ray detecting panels in opposite directions; and a second data reading circuit for horizontally reading data from the lower third and fourth X-ray detecting panels, which are positioned under the first and second X-ray detecting panels, in opposite directions.

In another embodiment, the scan driver includes a first scanning circuit circuit for scanning the first X-ray detecting panel from bottom to top; a second scan driving circuit for scanning the second X-ray detecting panel from bottom to top; a third scan driving circuit for scanning the third X-ray detecting panel from top to bottom; and a fourth scan driving circuit for scanning the fourth X-ray detecting panel from top to bottom.

The data reader then beneficially includes a first data reading circuit for reading data from the first X-ray detecting panel from left to right; a second data reading circuit for reading data from the second X-ray detecting panel from left to right; a third data reading circuit for reading data from the third X-ray detecting panel from left to right; and a fourth data reading circuit for reading data on the fourth X-ray detecting panel from left to right.

Alternatively, the data reader includes a first data reading circuit for reading data from the first X-ray detecting panel from right to left; a second data reading circuit for reading data from the second X-ray detecting panel from right to left; a third data reading circuit for reading data from the third X-ray detecting panel from left to right; and a fourth data reading circuit for reading data from the fourth X-ray detecting panel from left to right.

Alternatively, the data reader includes a first data reading circuit for reading data from the first X-ray detecting panel from left to right; a second data reading circuit for reading data from the second X-ray detecting panel from left to right; a third data reading circuit for reading data from the third X-ray detecting panel from right to left; and a fourth data reading circuit for reading data from the fourth X-ray detecting panel from right to left.

Alternatively, the data reader includes a first data reading circuit for reading data from the first X-ray detecting panel from right to left; a second data reading circuit for reading data of the second X-ray detecting panel from right to left; a third data reading circuit for reading data of the third X-ray detecting panel from left to right; and a fourth data reading circuit for reading data from the fourth X-ray detecting panel from left to right.

Alternatively, a composite X-ray panel is comprised of at least two vertically arranged X-ray detecting panels.

Then, the scan driver includes a first scan driving circuit for scanning a first X-ray detecting panel from bottom to top; and a second scan driving circuit for scanning the second X-ray detecting panel from top to bottom.

The data reader then reads data from the first and second X-ray detecting panels in the same direction.

Otherwise, the data reader reads data from the first and second X-ray detecting panels in opposite directions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 8:
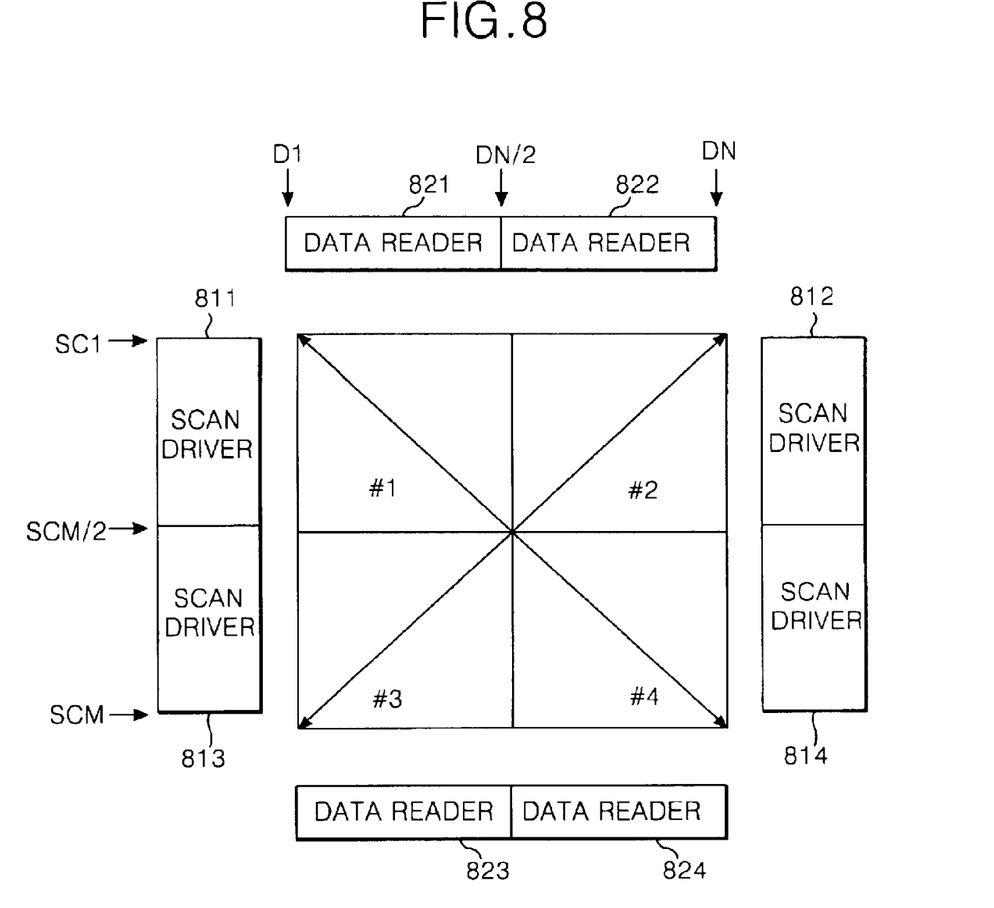
FIG. 8 is a block diagram showing a composite X-ray panel and its scanning method according to a first embodiment of the present invention.

Referring now to FIG. 8, an X-ray detecting device according to a first embodiment of the present invention includes a composite X-ray panel with four X-ray detecting panels #1 to #4 that are combined two by two in the horizontal and vertical directions. Gate lines and data lines are divided at each boundary between the X-ray detecting panels #1 to #4.

The X-ray detecting device in FIG. 8 includes scan drivers 811 to 814 for scanning the X-ray detecting panels #1 to #4, and data readers 821 to 824 for data reading. The first and second X-ray detecting panels #1 and #2 are simultaneously scanned upward (bottom to top), but data is read from the center of the composite X-ray panel in opposite directions. The third and fourth X-ray detecting panels #3 and #4 are scanned downward, but data is read from the center of the composite X-ray panel in opposite directions. The result is that the greatest amount of current leakage occurs at the edges of the X-ray detecting device. Thus, the X-ray data from the first and third X-ray detecting panels #1 and #3 are read from right to left, while the X-ray data from the second and fourth X-ray detecting panels #2 and #4 are read from left to right.

The first scan driver 811 scans the first X-ray detecting panel #1 from bottom to top (opposite to the prior art schemes previously discussed). That is, from the (M/2)th scan line SCM/2 to the 1st scan line SC1. The first data reader 821 samples and amplifies electric charges from capacitors Cst via data lines (D1 to DN/2) in a sequence that runs from the (N/2)th data line DN/2 to the 1st data line D1.

The second scan driver 812 scans the second X-ray detecting panel #2 upward from the (M/2)th scan line SCM/2 to the 1st scan line SC1. The second data reader 822 samples and amplifies electric charges inputted via data lines DN/2+1 to DN in a sequence that runs from the (N/2+1)th data line DN/2+1 into the Nth data line DN.

The third scan driver 813 scans the third X-ray detecting panel #3 in a downward sequence that runs from the (M/2+1)th scan line SCM/2+1 to the Mth scan line SCM. The third data reader 823 samples and amplifies electric charges from capacitors Cst via data lines D1 to DN/2 in a sequence that runs from the (N/2)th data line DN/2 to the 1st data line D1.

The fourth scan driver 814 scans the fourth X-ray detecting panel #4 in a downward sequence that runs from the (M/2+1)th scan line SCM/2+1 to the Mth scan line SCM. The fourth data reader 824 samples and amplifies electric charges via the data lines DN/2+1 to DN in a sequence that runs from the (N/2+1)th data line DN/2+1 to the Nth data line DN.

Figure 9:
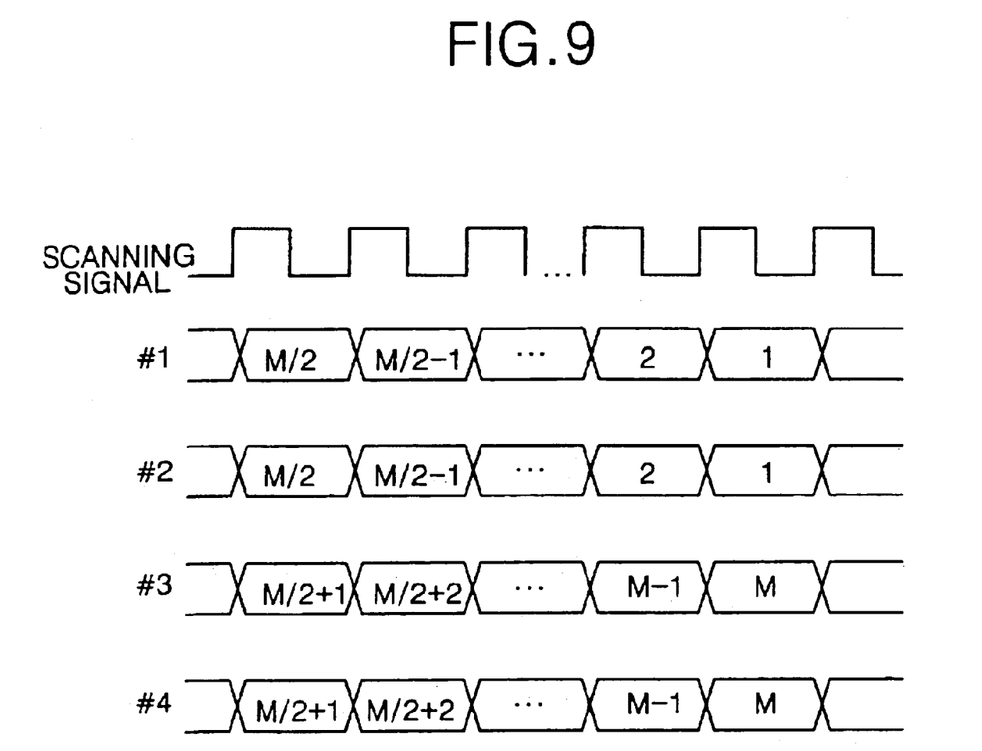
FIG. 9 illustrates scanning signal waveforms for the X-ray detecting device shown in FIG. 8.

FIG. 9 is a waveform diagram representing the data reading sequence of the first to fourth X-ray detecting panels #1 to #4 shown in FIG. 8. As shown, the first and second data readers 821 and 822 are synchronized with scanning signals generated from the first and second scan drivers 811 and 812, respectively, to read a data sequence from the (M/2)th scan line, ((M/2)−1)th scan line, . . . , the 2nd scan line and the 1st scan line. Further, the first and second data readers 821 and 822 read data from the center towards the sides of the panels. The third and fourth readers 823 and 824 are synchronized with scanning signals generated from the third and fourth scan drivers 813 and 814, respectively, so as to read data in a sequence that runs from the (M/2+1)th scan line, ((M/2)+2)th scan line, . . . , to the (M−1)th scan line and the Mth scan line. Further, the third and fourth data readers 823 and 824 read data from the center to the sides of the panels.

As a result, the X-ray detecting device illustrated in FIG. 8 implements scanning and data reading sequences that (simultaneously) run from the center to the edges of the panels. Accordingly, the brightness at the center is improved because current leakage at the center is minimized. This improves the image perceived by the observer, producing a high quality image.

Figure 10:
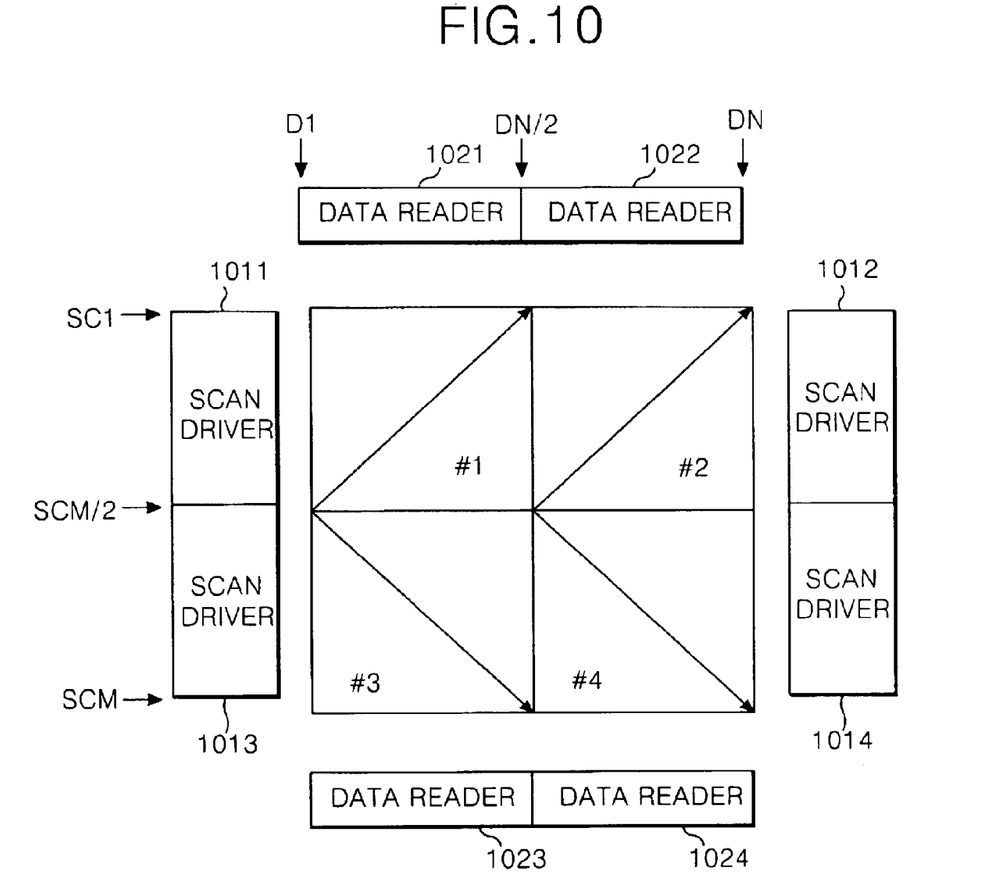
FIG. 10 is a block diagram showing a composite X-ray panel and its scanning method according to a second embodiment of the present invention.

Referring now to FIG. 10, an X-ray detecting device according to a second embodiment of the present invention includes first and second scan drivers 1011 to 1012 for scanning first and second X-ray detecting panels #1 and #2 upward from respective bottom-right corners. Additionally, third and fourth scan drivers 1013 and 1014 scan third and fourth X-ray detecting panels #3 and #4 downward from upper-left corners. Also included are data readers 1021 to 1024 for reading data from left to right.

The first and second scan drivers 1011 and 1012 scan the first and second X-ray detecting panels #1 and #2 in a sequence that runs from the (M/2)th scan line SCM/2 to the 1st scan line SC1. The first data reader 1021 samples and amplifies electric charges on capacitor Cst via data lines D1 to DN/2 in a sequence that runs from the 1st data line D1 into the N/2th data line DN/2. The second data reader 1022 samples and amplifies electric charges via the data lines DN/2+1 to DN in a sequence that runs from the (N/2+1)th data line DN/2+1 to the Nth data line DN.

The third and fourth scan drivers 1013 and 1014 scan the third and fourth X-ray detecting panels #3 and #4 in a downward sequence that runs from the ((M/2)+1)th scan line SCM/2+1 to the Mth scan line SCM. The third data reader 1023 samples and amplifies electric charges on capacitors Cst via data lines D1 to DN/2 in a sequence that runs from the 1st data line D1 to the N/2th data line DN/2. The fourth data reader 1024 samples and amplifies electric charges via data lines DN/2+1 to DN in a sequence that runs from the (N/2+1)th data line DN/2+1 to the Nth data line DN.

Figure 11:
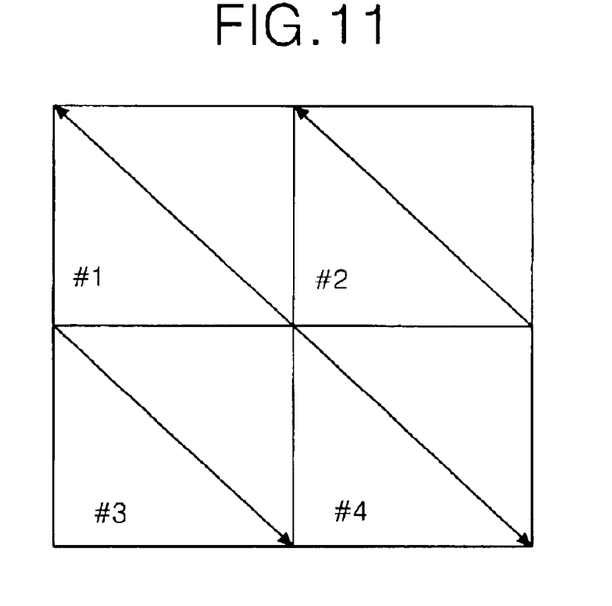
FIG. 11 is a plan view representing a scanning method of a composite X-ray panel according to a third embodiment of the present invention.

Referring now to FIG. 11, an X-ray detecting device according to a third embodiment of the present invention simultaneously scans the first and second X-ray detecting panels #1 and #2 in a sequence from bottom to top. Simultaneously, the third and fourth X-ray detecting panels #3 and #4 are scanned in a sequence that runs from top to bottom. X-ray data is read from the first and second X-ray detecting panels #1 and #2 in a sequence that runs from right to left. At the same time, the third and fourth X-ray detecting panels #3 and #4 are read in a sequence that runs from left to right.

Figure 12:
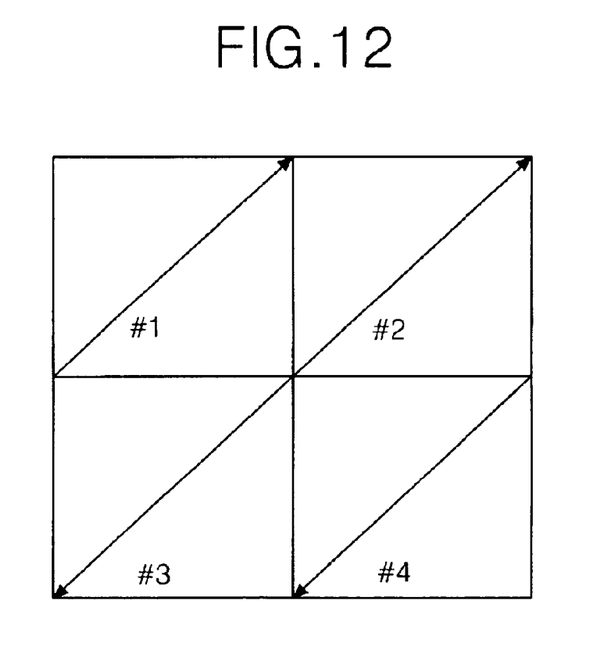
FIG. 12 is a plan view representing a scanning method of a composite X-ray panel according to a fourth embodiment of the present invention.

Referring now to FIG. 12, an X-ray detecting device according to a fourth embodiment of the present invention scans the first and second X-ray detecting panels #1 and #2 in a sequence that runs from bottom to top. Simultaneously, the third and fourth X-ray detecting panels #3 and #4 are scanned in a sequence that runs from top to bottom. This X-ray detecting device reads X-ray data from the first and second panels #1 and #2 in a sequence that runs from left to right. A the same time, data from the third and fourth X-ray detecting panels #3 and #4 are read in a sequence that runs from right to left.

The foregoing scanning schemes are also suitable for scanning a composite X-ray panel comprised of two X-ray detecting panels.

Figure 13:
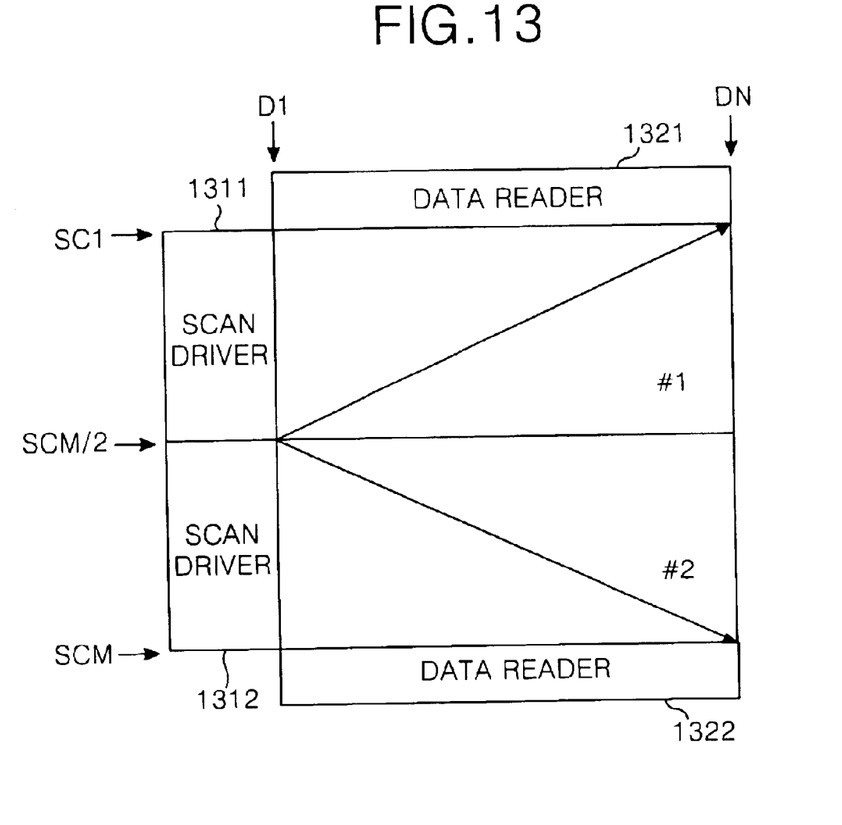
FIG. 13 is a plan view representing a scanning method of a composite X-ray panel according to a fifth embodiment of the present invention.

Referring now to FIG. 13, an X-ray detecting device according to a fifth embodiment of the present invention has a composite X-ray panel that is comprised of two vertically orientated X-ray detecting panels #1 and #2. The scan lines divide at the boundary between X-ray detecting panels #1 and #2. This X-ray detecting device includes scan drivers 1311 and 1312 for scanning the first and second X-ray detecting panels #1 and #2 in opposite directions, and data readers 1321 to 1322 for reading X-ray data in a sequence that runs from right to left.

The first scan driver 1311 scans the first X-ray detecting panel #1 from the (M/2)th scan line SCM/2 to the 1st scan line SC1 (bottom to top). The first data reader 1321 samples and amplifies electric charges stored in capacitors Cst via data lines D1 to DN in a sequence that runs from the 1st data line D1 to the Nth data line DN (left to right).

At the same time, the second scan driver 1312 scans the second X-ray detecting panel #2 in going from the (M/2+1)th scan line SCM/2+1 to the Mth scan line SCM (top to bottom). The second data reader 1322 samples and amplifies electric charges via data lines D1 to DN in a sequence that runs from the 1st data line D1 to the Nth data line DN (left to right).

Figure 14:
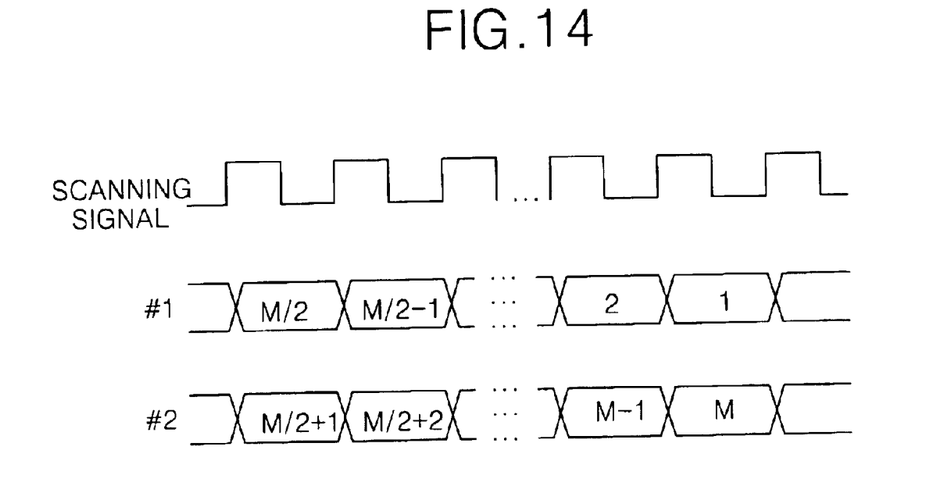
FIG. 14 illustrates scanning signal waveforms for the X-ray detecting device shown in FIG. 13.

FIG. 14 is a waveform diagram representing a data reading sequence for the X-ray detecting panels #1 and #2. As shown, the first data reader 1321 is synchronized with a scanning signal generated from the first scan driver 1311 so as to read data in a sequence of the (M/2)th scan line, ((M/2)−1)th scan line, . . . , to the 2nd scan line and the 1st scan line. Further, the first data reader 1321 reads data from left to right. The second reader 1322 is synchronized with a scanning signal generated from the second scan driver 1312 so as to read data in a sequence of the (M/2+1)th scan line, ((M/2)+2)th scan line, . . . , to the (M−1)th scan line and the Mth scan line. Further, the second data reader 1322 reads data from left to right.

Figure 15:
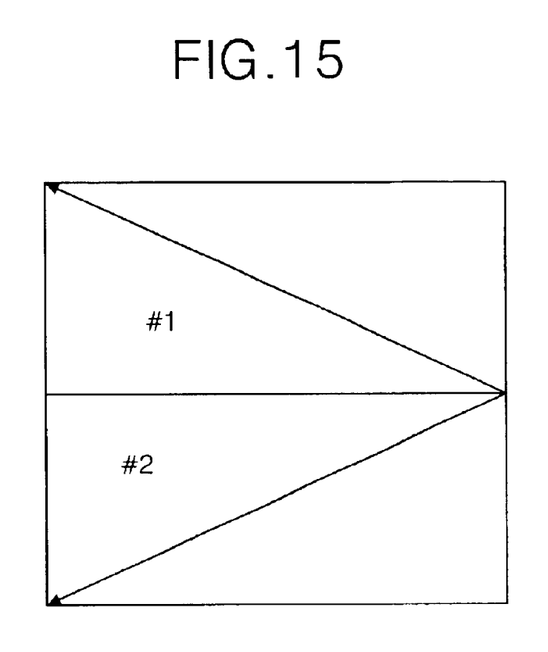
FIG. 15 is a plan view representing a scanning method of a composite X-ray panel according to a sixth embodiment of the present invention.

Referring now to FIG. 15, an X-ray detecting device according to a sixth embodiment of the present invention has first and second X-ray detecting panels #1 and #2 that are vertically combined. This X-ray detecting device scans the first and second X-ray detecting panels #1 and #2 from the middle of the composite X-ray panel to the edges, and reads X-ray data from the from right to left.

The first X-ray detecting panel #1 is scanned upwards while the second X-ray detecting panel #2 is scanned downward. As the first and second X-ray detecting panels #1 and #2 are thus scanned, X-ray data from the first and second X-ray detecting panels #1 and #2 are read while being shifted from right to left.

Figure 16:
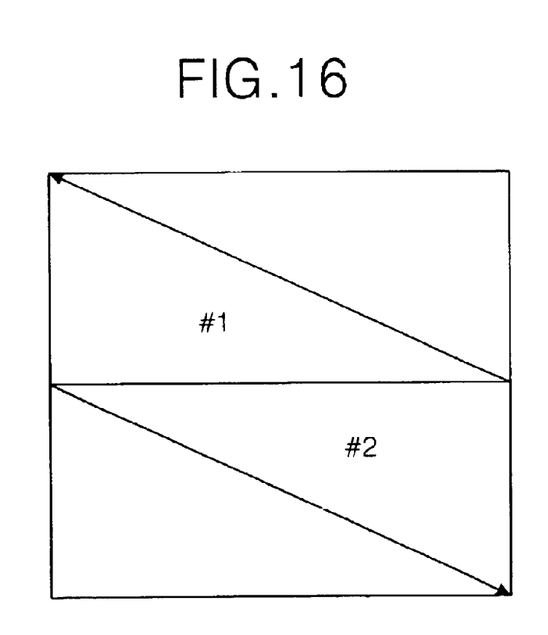
FIG. 16 is a plan view representing a scanning method of a composite X-ray panel according to a seventh embodiment of the present invention.

Referring now to FIG. 16, an X-ray detecting device according to a seventh embodiment of the present invention includes vertically combined first and second X-ray detecting panels #1 and #2. This X-ray detecting device reads X-ray data in such a manner that the first and second X-ray detecting devices #1 and #2 are read in contrary directions.

The first X-ray detecting panel #1 is scanned from bottom up, while the second X-ray detecting panel #2 is scanned from top down. As the first and second X-ray detecting panels #1 and #2 are thus scanned, X-ray data from the first X-ray detecting panel #1 is read from right to left, while X-ray data from the second X-ray detecting panel #2 is read from left to right.

Figure 17:
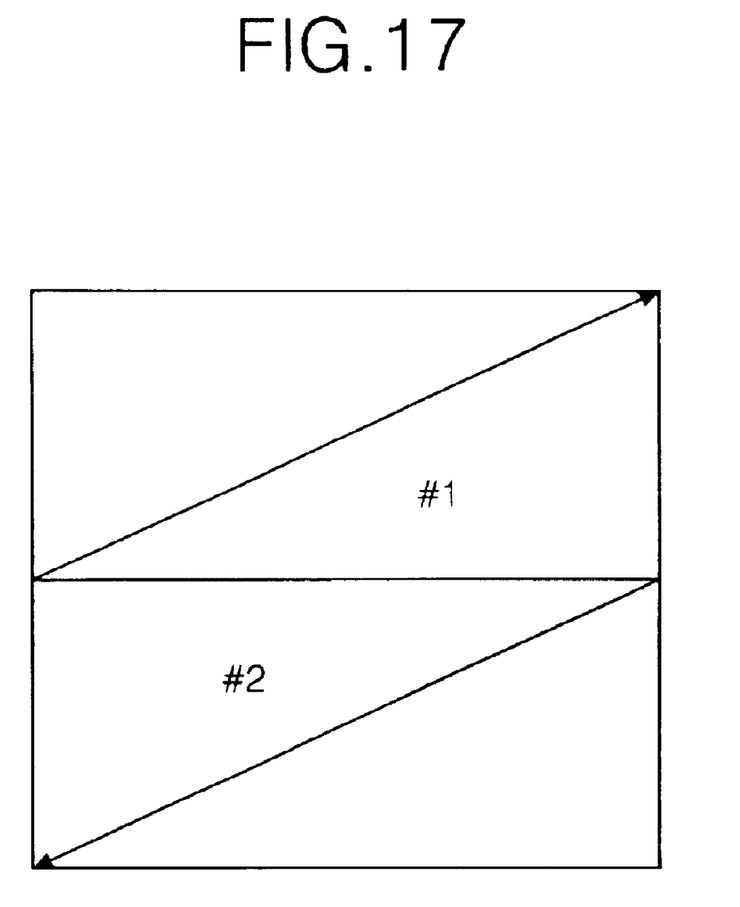
FIG. 17 is a plan view representing a scanning method of a composite X-ray panel according to an eighth embodiment of the present invention.

Referring now to FIG. 17, an X-ray detecting device according to an eighth embodiment of the present invention has vertically combined first and second X-ray detecting panels #1 and #2. The first X-ray detecting panel #1 is scanned from bottom to top, while the second X-ray detecting panel #2 is scanned from top to bottom. As the first and second X-ray detecting panels #1 and #2 are being scanned in this manner, X-ray data from the first X-ray detecting panel #1 is read from left to right, while the X-ray data of the second X-ray detecting panel #2 is read from right to left.

As described above, according to the present invention, the X-ray detecting device is made by a composite X-ray panel that is comprised of at least two X-ray detecting panels. Scanning and reading sequences are such that brightness deterioration near the center portion of the panel is reduced, thereby improving image quality.

Although the present invention has been explained by the embodiments shown in the drawings described above, it should be understood to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of driving an X-ray detecting device, comprising:
    scanning a composite X-ray panel having at least two X-ray detecting panels using a scanning sequence that runs from the center of the composite X-ray panel towards an outer edge of a first of the at least two X-ray detecting panels; and
    reading data from the at least two X-ray detecting panels upon scanning;
    wherein all the scanning directions for the X-ray detecting panels are substantially parallel.

2. The method according to claim 1, wherein the at least two X-ray detecting panels have different data reading directions.

3. The method according to claim 1, wherein the at least two X-ray detecting panels have the same data reading direction.

4. The method according to claim 1, wherein the at least two X-ray detecting panels have different scanning directions.

5. The method according to claim 1, wherein all X-ray detecting panels have the same data reading direction.

6. An X-ray detecting device, comprising:
    a composite X-ray panel made by combining at least two X-ray detecting panels;
    a scan driver for scanning the composite X-ray panel using a sequence that runs from the center of the composite X-ray panel towards a vertical edge of a first of the at least two X-ray detecting panels; and
    a data reader for reading data from the at least two X-ray detecting panels upon scanning;
    wherein all the scanning directions for the X-ray detecting panels are substantially parallel.

7. The apparatus according to claim 6, wherein the data reader reads data from the at least two X-ray detecting panels in the same data reading direction.

8. The apparatus according to claim 6, wherein the data reader reads data from the at least two X-ray detecting panels in different data reading directions.

9. The apparatus according to claim 6, wherein the composite X-ray panel includes first and second upper X-ray detecting panels and third and fourth lower X-ray detecting panels.

10. The apparatus according to claim 9, wherein the scan driver includes:

a first scan driving circuit for vertically scanning the first and second upper X-ray detecting panels in a first scanning direction; and
    a second scan driving circuit for vertically scanning the third and fourth lower X-ray detecting panels in a second scanning direction that is different from the first scanning direction.

11. The apparatus according to claim 9, wherein the data reader includes:
    a first data reading circuit for reading data from the first and second upper X-ray detecting panels in different data reading directions; and
    a second data reading circuit for reading data from the third and fourth lower X-ray detecting in different data reading directions.

12. The apparatus according to claim 9, wherein the scan driver includes:
    a first scanning circuit for scanning the first X-ray detecting panel from bottom to top;
    a second scanning circuit for scanning the second X-ray detecting panel from bottom to top;
    a third scanning circuit for scanning the third X-ray detecting panel from top to bottom; and
    a fourth scanning circuit for scanning the fourth X-ray detecting panel from top to bottom.

13. The apparatus according to claim 12, wherein the data reader includes:
    a first data reading circuit for reading data from the first X-ray detecting panel from right to left;
    a second data reading circuit for reading data from the second X-ray detecting panel from left to right;
    a third data reading circuit for reading data from the third X-ray detecting panel from right to left; and
    a fourth data reading circuit for reading data from the fourth X-ray detecting panel from left to right.

14. The apparatus according to claim 12, wherein the data reader includes:
    a first data reading circuit for reading data from the first X-ray detecting panel from left to right;
    a second data reading circuit for reading data from the second X-ray detecting panel from left to right;
    a third data reading circuit for reading data from the third X-ray detecting panel from left to right; and
    a fourth data reading circuit for reading data from the fourth X-ray detecting panel from left to right.

15. The apparatus according to claim 12, wherein the data reader includes:
    a first data reading circuit for reading data from the first X-ray detecting panel from right to left;
    a second data reading circuit for reading data from the second X-ray detecting panel from right to left;
    a third data reading circuit for reading data from the third X-ray detecting panel from left to right; and
    a fourth data reading circuit for reading data from the fourth X-ray detecting panel from left to right.

16. The apparatus according to claim 12, wherein the data reader includes:
    a first data reading circuit for reading data from the first X-ray detecting panel from left to right;
    a second data reading circuit for reading data from the second X-ray detecting panel from left to right;

a third data reading circuit for reading data from the third X-ray detecting panel from right to left; and a fourth data reading circuit for reading data from the fourth X-ray detecting panel from right to left.

17. The apparatus according to claim 6, wherein the composite X-ray panel has two vertically orientated X-ray detecting panels.

18. The apparatus according to claim 17, wherein the scan driver includes:

a first scanning circuit for scanning a first X-ray detecting panel from bottom to top; and a second scan scanning circuit for scanning a second X-ray detecting panel from top to bottom.

19. The apparatus according to claim 18, wherein the data reader reads data from the two X-ray detecting panels in the same direction.

20. The apparatus according to claim 19, wherein the data reader reads data from the two X-ray detecting panels from left to right.

21. The apparatus according to claim 19, wherein the data reader reads data from the two X-ray detecting panels from right to left.

22. The apparatus according to claim 18, wherein the data reader reads data from the two X-ray detecting panels in different directions.

* * * * *